United States Patent
Ghaly et al.

(10) Patent No.: US 9,397,703 B2
(45) Date of Patent: Jul. 19, 2016

(54) ADAPTIVE READ ERROR RECOVERY FOR MEMORY DEVICES

(71) Applicant: Seagate Technology LLC, Cupertino, CA (US)

(72) Inventors: Mai A. Ghaly, Bloomington, MN (US); Ara Patapoutian, Hopkinton, MA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/096,752

(22) Filed: Dec. 4, 2013

(65) Prior Publication Data
US 2015/0154065 A1    Jun. 4, 2015

(51) Int. Cl.
| | |
|---|---|
| *H03M 13/17* | (2006.01) |
| *G11B 20/18* | (2006.01) |
| *G11B 5/012* | (2006.01) |
| *G06F 11/07* | (2006.01) |
| *G06F 11/14* | (2006.01) |
| *G06F 11/10* | (2006.01) |

(52) U.S. Cl.
CPC ............. *H03M 13/17* (2013.01); *G06F 11/073* (2013.01); *G06F 11/079* (2013.01); *G06F 11/0793* (2013.01); *G06F 11/1048* (2013.01); *G06F 11/1402* (2013.01); *G11B 5/012* (2013.01); *G11B 20/1833* (2013.01); *G06F 11/141* (2013.01); *G11B 2020/185* (2013.01)

(58) Field of Classification Search
CPC ... H03M 13/17; G11B 5/012; G11B 20/1833; G11B 2020/185
See application file for complete search history.

(56) References Cited

U.S. PATENT DOCUMENTS

| | | | | | |
|---|---|---|---|---|---|
| 5,051,998 | A | * | 9/1991 | Murai et al. | 714/762 |
| 5,241,546 | A | * | 8/1993 | Peterson et al. | 714/761 |
| 5,497,111 | A | * | 3/1996 | Cunningham | 327/58 |
| 5,610,929 | A | * | 3/1997 | Yamamoto | 714/785 |
| 5,631,909 | A | * | 5/1997 | Weng et al. | 714/704 |
| 5,701,314 | A | * | 12/1997 | Armstrong et al. | 714/765 |
| 5,818,656 | A | * | 10/1998 | Klaassen et al. | 360/67 |
| 5,856,983 | A | * | 1/1999 | Okazaki | 714/721 |
| 5,872,666 | A | * | 2/1999 | Saiki et al. | 360/46 |
| 5,880,900 | A | * | 3/1999 | Okada et al. | 360/75 |
| 5,917,670 | A | * | 6/1999 | Scaramuzzo et al. | 360/53 |
| 6,049,439 | A | * | 4/2000 | Ono et al. | 360/53 |
| 6,088,176 | A | * | 7/2000 | Smith et al. | 360/46 |
| 6,119,261 | A | * | 9/2000 | Dang et al. | 714/769 |
| 6,130,793 | A | * | 10/2000 | Ohmori et al. | 360/53 |
| 6,151,246 | A | * | 11/2000 | So | B64C 27/006 365/185.09 |
| 6,389,571 | B1 | * | 5/2002 | Yang et al. | 714/766 |
| 6,421,193 | B1 | * | 7/2002 | Li | 360/25 |
| 6,446,236 | B1 | * | 9/2002 | McEwen et al. | 714/795 |
| 6,557,113 | B1 | * | 4/2003 | Wallentine et al. | 714/5.1 |

(Continued)

OTHER PUBLICATIONS

Sep. 8, 2015, File History for U.S. Appl. No. 14/096,733.

*Primary Examiner* — Joseph D Torres
(74) *Attorney, Agent, or Firm* — Hollingsworth Davis, LLC

(57) ABSTRACT

Some embodiments involve a method of detecting an error of a memory device. It is determined whether the detected error is a catastrophic error. If it is determined that the error is a catastrophic error, an error recovery process is bypassed. Some aspects involve a method of detecting an error of a memory device. It is determined whether a counter value is above a predetermined value. If it is determined that the counter value is above the predetermined value an error recovery process is bypassed and a redundant parity recovery process is performed.

19 Claims, 9 Drawing Sheets

(56) References Cited

U.S. PATENT DOCUMENTS

| | | | |
|---|---|---|---|
| 6,757,117 B1* | 6/2004 | Livingston | 360/25 |
| 7,171,607 B2* | 1/2007 | Tsunoda | 714/765 |
| 7,266,750 B1* | 9/2007 | Patapoutian et al. | 714/758 |
| 2002/0008928 A1* | 1/2002 | Takahashi | 360/53 |
| 2004/0093549 A1* | 5/2004 | Song et al. | 714/752 |
| 2005/0114727 A1 | 5/2005 | Corbett et al. | |
| 2005/0152488 A1 | 7/2005 | Buckwalter et al. | |
| 2010/0214862 A1 | 8/2010 | Kim et al. | |
| 2012/0265927 A1 | 10/2012 | Cho et al. | |
| 2013/0083418 A1 | 4/2013 | Worrell et al. | |
| 2013/0094288 A1 | 4/2013 | Patapoutian et al. | |
| 2014/0047269 A1 | 2/2014 | Kim | |
| 2014/0173382 A1* | 6/2014 | Yang | G06F 11/1072 714/773 |

* cited by examiner

ADAPTIVE READ ERROR RECOVERY FOR MEMORY DEVICES

SUMMARY

Some embodiments involve a method of detecting an error of a memory device. It is determined whether the detected error is a catastrophic error. If it is determined that the error is a catastrophic error, an error recovery process is bypassed. Some aspects involve a method of detecting an error of a memory device. It is determined whether a counter value is above a predetermined value. If it is determined that the counter value is above the predetermined value an error recovery process is bypassed and a redundant parity recovery process is performed.

Some implementations involve a controller that is capable of being coupled to a memory, the controller is configured to perform detecting that an error of the memory is a catastrophic error and if it is determined that the error is a catastrophic error, bypassing a voltage error recovery process.

The above summary is not intended to describe each disclosed embodiment or every implementation of the present disclosure. The figures and the detailed description below more particularly exemplify illustrative embodiments.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
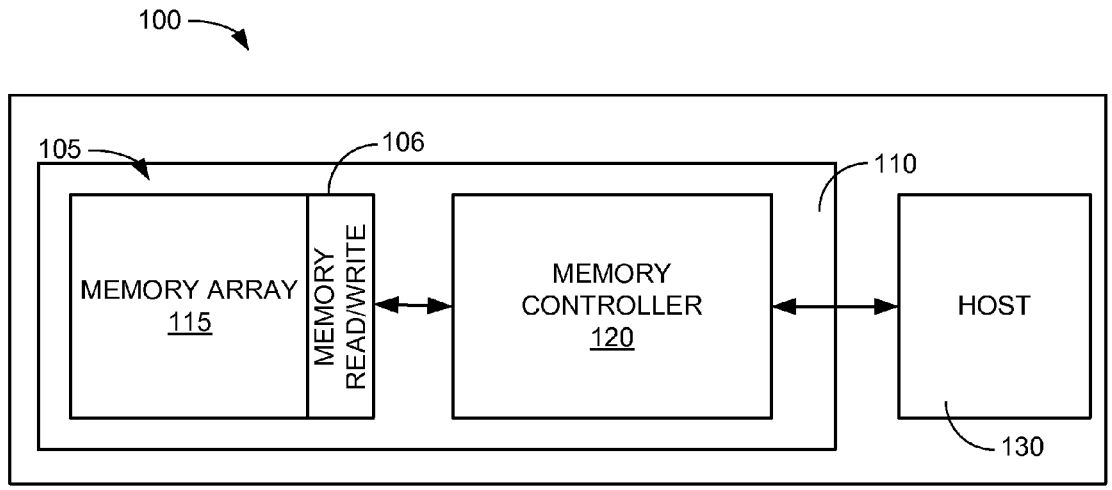
FIGS. 1A-1D are block diagram of a system capable of implementing an error recovery process in accordance with embodiments described herein.

Non-volatile memory devices are capable of retaining stored data for relatively long periods of time, even in the absence of external power. The memory may be of various types comprising, magnetic data storage drives and/or hybrid drives that incorporate both magnetic drives and solid state media. Non-volatile, solid-state memory includes floating gate memory, e.g., flash memory, which programs data into memory cells by applying a voltage to the memory cell, the applied voltage causing a charge to be stored on a floating gate of a transistor. The data can be read later from the memory cell by sensing the voltage of the transistor and comparing the sensed voltage to one or more read threshold voltages, $V_T$s.

Memory cells in solid state devices are known to exhibit errors caused, for example, by charge leakage, manufacturing defects, disturb effects, and interference. These errors may be manifested as bit errors in the decoded data. According to various embodiments, the memory device is a hard disk drive. Several types of catastrophic errors in a hard disk drive include media scratch, thermal asperities, buried defects, adjacent track encroachment, and adjacent track interference.

A memory device may use a number of measures to account for these errors, such as error correction codes (ECC) that utilize extra data for detecting and correcting errors. In some cases, the memory device may generate a bit error rate (BER) signal based on ECC activity and can use BER to analyze system performance.

Memory devices may comprise single-level memory cells or multi-level memory cells. Single level cell (SLC) memory uses memory cells that store one bit of data per cell. Data is read from the SLC by sensing the voltage of the memory cell and comparing the sensed voltage to a threshold voltage. If the sensed voltage is greater than the threshold voltage, it is determined that the bit is in a first state, e.g., the "0" state, and if the sensed voltage is less than the threshold voltage, it is determined that the bit is in a second state, e.g., the "1" state. In multi-level cell (MLC) memory, the memory cells can be programmed to store two or more bits of information. For example, a two bit MLC is capable of storing four two bit symbols, 00, 01, 10, 11, each symbol corresponding to a different voltage level stored in the memory cell.

In general, a memory cell may be programmed to a number of voltages, M, where M can represent any of $2^m$ memory states. The value m is equal to the number of bits stored, and is greater than 1 for MLC memory. For example, memory cells programmable to four voltages can store two bits per cell (M=4, m=2); memory cells programmable to eight voltages have a storage capacity of three bits per cell (M=8, m=3), etc.

The memory cells of a memory device can be grouped into data units referred to herein as data pages or blocks. A data page can correspond, for example, to a group of memory cells that are read together during a read operation. A group of memory pages that are erased at substantially the same time may be referred to as a block or erasure unit. Memory cells are programmed in units of pages and the pages are not re-programmed, once programmed, until after the block of pages is erased. Garbage collection operations can be performed on the blocks of pages, wherein the blocks are erased after active data stored in each block is moved to another location. Thus, as a result of garbage collection, each memory cell of the memory device undergoes numerous program/erase (PE) cycles during the lifetime of the memory cell. In floating gate transistor memory cells, each PE cycle can degrade the cell, and after many PE cycles, lead to a decreased ability of the cell to retain data without substantial charge leakage.

Charge loss or charge gain in the memory cells may lead to data errors such that data read from the memory cells does not correspond to the originally stored data. The errors in reading the data may be decreased by modifying the read threshold voltage ($V_T$) used to read data stored in the memory cells. Charge loss through such means as, for example, charge leakage causes the voltage stored in the floating gate of the memory cell to shift to the negative voltage shift (−ve) direction while disturb effects may cause the voltage stored on the floating gate of the memory cell to shift to the positive voltage shift (+ve) direction. Other types of errors may be due to interference in the system, for example.

According to various embodiments, error correction and recovery may be considerations in the reliability of any storage system storage system. And a memory system may do whatever it takes to return correct data back to the host. Both error correction and error recovery are used to for decreasing the number of unrecoverable error rates. The unrecoverable error rate constraint may be between $10^{-15}$ to $10^{-16}$, for example. Many times, error correction is done on the fly and provides up to 5 to 6 orders gain in corrected BER. In the event that error correction fails, an error recovery process is used to fill the gap between corrected and uncorrected error rate. An error recovery process that can return the correct data efficiently may be desired. In many error recovery systems, error recovery goes through various steps based on the most likely cause of the failure, for example, a charge loss error may be the most common type of error and in this case, the system will attempt to recover the data based on this first. A charge gain error may be a next most likely error type and so on. If a system can determine a likely type of error before the error recovery process begins, the system may be able to bypass inapplicable recovery steps and more quickly apply the appropriate recovery sequence. While adding the additional steps of filtering a type of error may add complication to the system, it may offer recovery time saving. Thus, attempting to determine an error type early in the error recovery process may increase reliability. For example, determining an error type early in the error recovery process may increase reliability in the later part of the life of the memory device. There may be a finite time to execute error recovery algorithms (for example 1 sec), and therefore attempting a more efficient error recovery algorithm may be desirable. An error recovery process may be different in a solid state memory device and a hard disk drive. For example, error recovery in a solid state memory device may include endurance and/or retention loss recovery while an error recovery process for a hard disk drive may include data amplitude and phase recovery and/or synchronization mark recovery.

An error recovery process may determine that an error is a catastrophic error. A catastrophic error may be an error that is not correctable by ECC, extended ECC and or any of the steps included in a standard error recovery process. Thus, detection of a catastrophic error may imply that the error is uncorrectable by a standard recovery process. To determine that an error is a catastrophic error, a counter may be used to determine if a codeword failed to converge due to a catastrophic event that caused a substantial or complete data loss. In the event that a catastrophic error is detected, the system may use a redundant outer codeword parity to recover the failing codeword using an ECC system. In some cases the outer code is based on Reed Solomon ECC. According to various embodiments, the system may determine that the error was the result of a voltage threshold shift. If the system determines that the error is probably not a the result of a voltage threshold shift or a catastrophic error, the system may determine that the error is most likely an error that resulted from an interference event and the system may apply interference cancellation recovery and bypass error recovery processes directed towards recovery of a voltage threshold shift. According to various embodiments, if the system fails to recover through the detected error type recovery, the system will continue to go through the standard recovery sequence.

FIG. 1A is a block diagram of a system 100 capable of implementing an error recovery process in accordance with embodiments described herein. Reading the data includes adjusting one or more $V_T$ values used for reading data to achieve bit error rates (BERs) less than a predetermined value. The system 100 includes a memory element 110 that may be coupled for communication with a host processor 130. The memory element 110 comprises a memory 105 and a memory controller 120 that is in communication with the host 130. The memory includes a memory cell array 115 and a memory read/write element 106. The memory controller 120 shown in FIG. 1A is configured to implement a recovery process in accordance with embodiments described herein. For example, the memory controller 120 may be configured to implement the flow diagrams of FIGS. 4A, 4B, 5A, and 5B as discussed in more detail below.

The block diagram of FIG. 1A and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. For example, alternative embodiments may provide all or a portion of the functionality of the memory controller 120 within the host 130. Other implementations may encompass the read/write element 106 included with the functions of the controller 120. The various approaches described herein may be implemented using hardware, software, or a combination of hardware and software. Memory chips, controller chips and/or chips of the host computer may contain one or more of the functional elements discussed herein, for example.

Figure 1B:
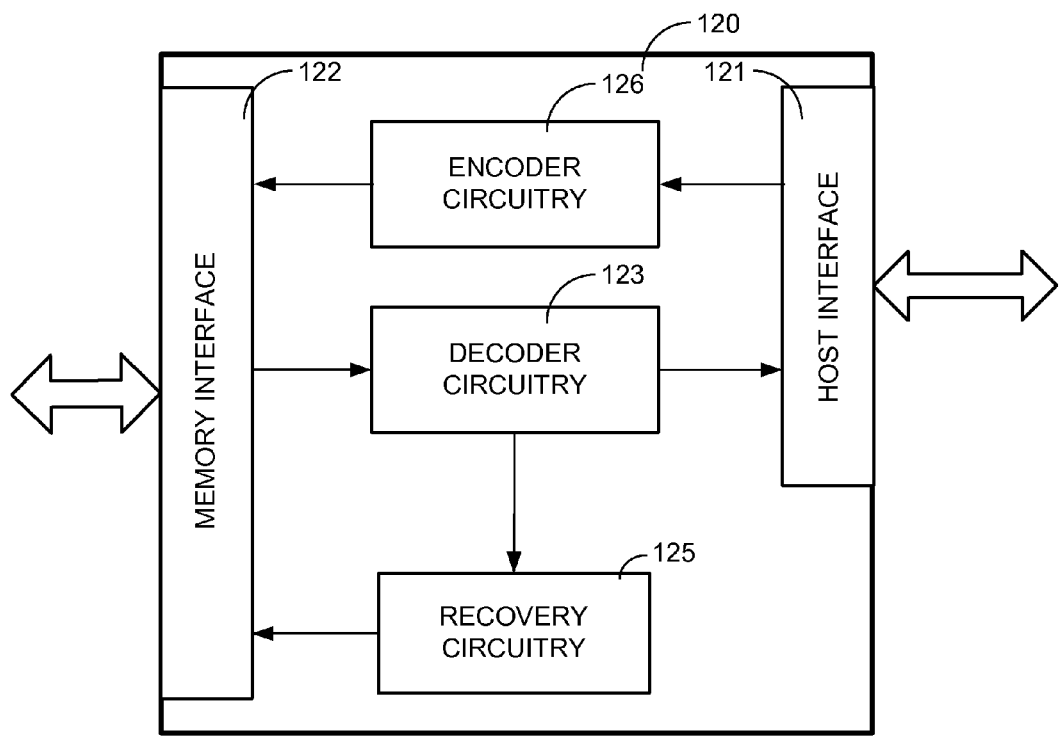

FIG. 1B provides a more detailed view of the memory controller 120 of FIG. 1A including voltage recovery circuitry in accordance with some embodiments discussed herein. The memory controller 120 shown in FIG. 1B comprises a host interface 121, a memory interface 122, encoder circuitry 126, decoder circuitry 123, and voltage recovery circuitry 125. The memory interface 122 serves to permit the memory controller 120 to communicate with the memory device 110. The host interface 121 serves to permit communication between the memory controller 120 and the host 130. The host interface 121 passes data that is to be stored in the memory device 110 to the encoder circuitry 126. The encoder circuitry 126 encodes the data using an error correcting code (ECC) and provides the encoded data to the memory interface 122.

To implement write operations, the memory read/write element 106 receives the encoded data from the memory interface 122 and generates signals that cause the encoded data to be stored in memory cells of the memory array 115. To implement read operations, the memory read/write circuitry 106 senses the voltages of the memory cells in the memory array 115, and compares the sensed voltages to one or more threshold voltages, $V_T$s. By comparing the sensed voltage of the cell to the $V_T$s, the voltage level of the memory cell can be ascertained. The voltage level represents the data stored in the memory cells of the memory cell array 115. The memory interface 122 passes data that is read from the memory cell array 115 to the decoder circuitry 123. The data read from the memory cells is decoded by the decoder and the decoded data can be transmitted through the host interface 121 to a host (e.g., host 130 in FIG. 1A).

In some embodiments, the decoder circuitry 123 and the voltage recovery circuitry 125 operate in cooperation with other system components to determine an optimal $V_T$. Once an optimal $V_T$ (or set of $V_T$s in the case of MLC devices) is determined, that $V_T$ or set of $V_T$s may be used to read additional data, e.g., a subsequent read of the same memory unit or to read other memory units, e.g., a memory unit may be a page of memory. A PE cycle counter may determine a number of program/erase cycles of the memory unit. In some cases, the system includes scan circuitry that is configured to control periodic scanning of memory cells.

Figure 1C:
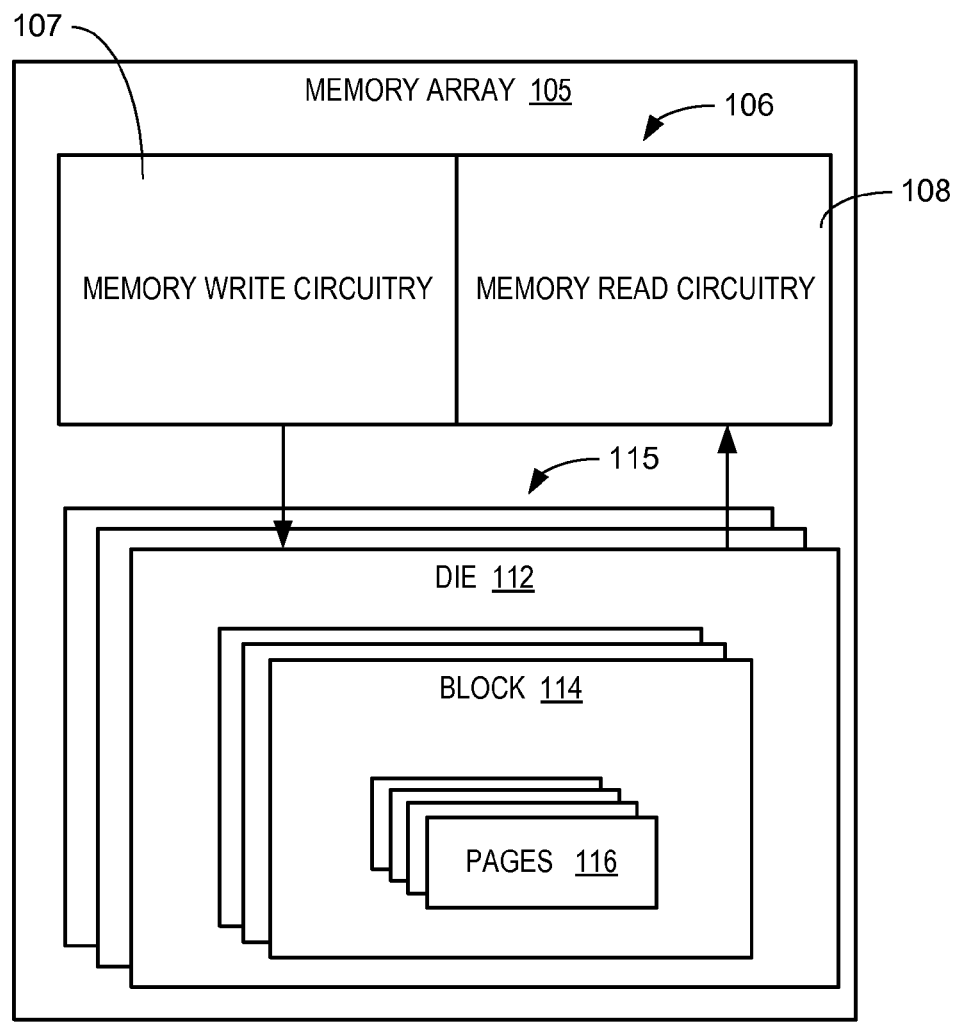
Figure 1D:
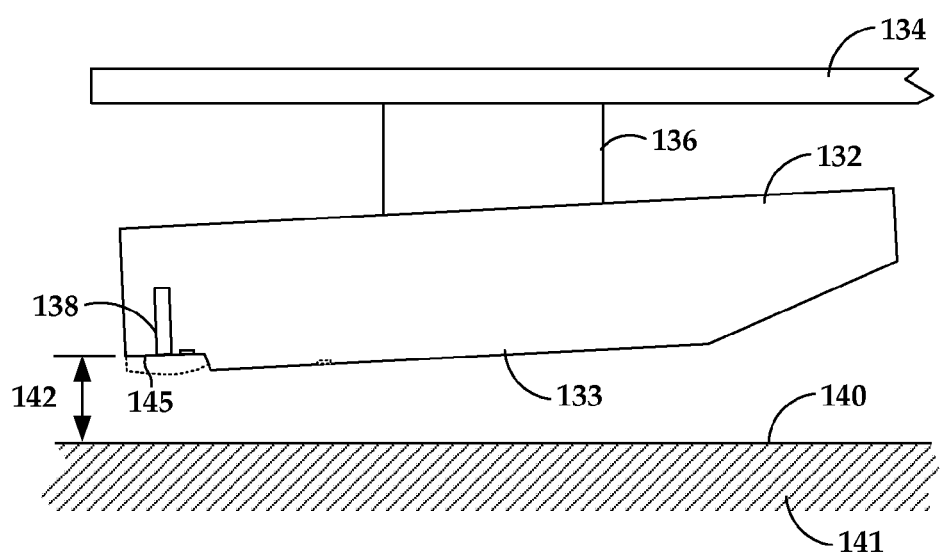

According to various implementations, embodiments described herein may be used in conjunction with a memory device that utilizes magnetic media. FIG. 1C, a block diagram, shows a side view of a magnetic sensor employed in a hard drive slider 132 according to an example embodiment. The slider 132 is coupled to an arm 134 by way of a suspension 136 that allows some relative motion between the slider 132 and arm 134. The slider 132 includes read/write transducers 138 at a media reading surface 145 near a trailing edge of the slider 132. The transducers 138 are held proximate to a surface 140 of a magnetic recording medium, e.g., magnetic disk 141, when reading and writing to the medium. When the slider 132 is located over surface 140 of the disk 141, a fly height 142 is maintained between the slider 132 and the surface 140 by a downward force of arm 134. This downward force is counterbalanced by an air cushion that exists between the surface 140 and an air bearing surface 133 of the slider 132 when the disk 141 is rotating.

According to various implementations, implementations described herein are used in a solid state memory device. FIG. 1C provides a more detailed view of the memory 105 of FIG. 1A for a solid state memory device. In the illustrated embodiment, the memory 105 includes memory cell array 115 having memory cells arranged in pages 116, blocks 114, and die 112. As previously discussed, the memory includes memory read/write circuitry 106 arranged to read data from and write data to the memory cell array 115. The memory read/write circuitry includes memory write circuitry 107 and memory read circuitry 108. The memory read circuitry 108 is capable of using $V_T$s to read the voltage on the memory cells and thus obtain data stored in the memory cells.

Figure 2A:
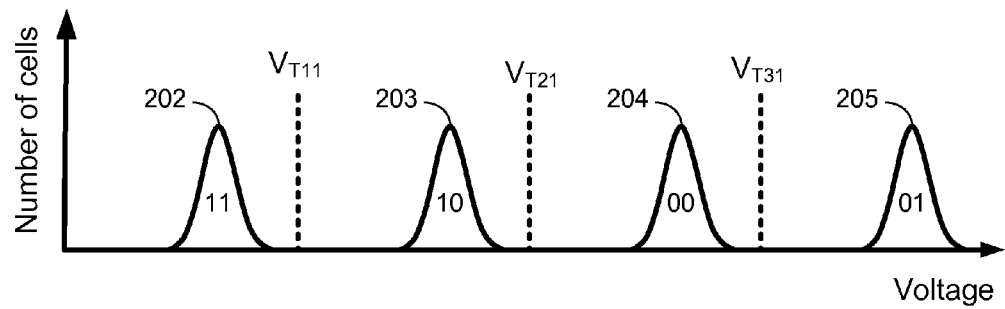
FIGS. 2A and 2B show examples of the voltage distribution of data stored a two-bit per cell multi-level memory cell (MLC) device.
Figure 2B:
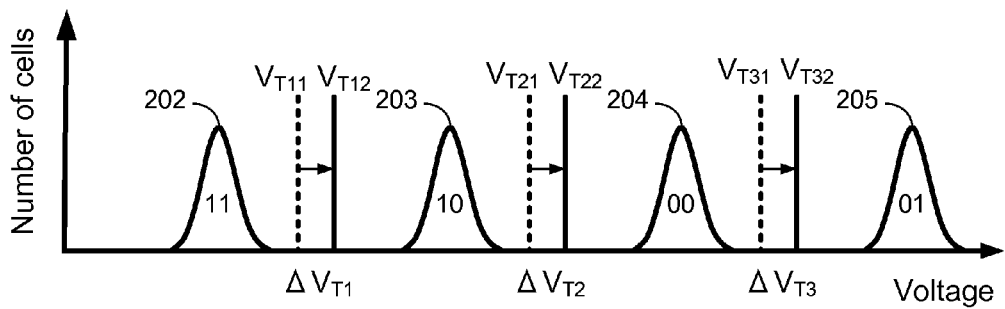

For example, consider the voltage distributions 202, 203, 204, 205 of a two-bit per cell MLC memory as shown in FIGS. 2A and 2B. A two-bit per cell memory has four possible states, corresponding to four data symbols 11, 10, 00, 01. Each symbol corresponds to a particular voltage level. When memory cells are programmed, the cells are charged to a target voltage level corresponding to the two bits of data being stored. The number of memory cells across a memory unit (e.g., a block or a page of memory) corresponding to each state 11, 10, 00, 01 can be assumed fall into a Gaussian distribution based on the voltages of the cells, as shown in FIG. 2A. Assuming the Gaussian distribution, when the voltages are read from the memory cells, the sensed voltages of cells of a page (or other unit) of the MLC memory device may be distributed around the target voltage levels and fall within voltage distributions 202-205, respectively. Voltage distribution 202 includes the voltages of the memory cells corresponding to symbol 11, distribution 203 includes the voltages of the memory cells corresponding to symbol 10, voltage distribution 204 includes the voltages of the memory cells corresponding to symbol 00, and voltage distribution 205 includes the voltages of the memory cells corresponding to symbol 01.

As shown in FIG. 2A, $V_{T11}$, $V^{T21}$, $V_{T31}$ are a set of read threshold voltages that are used to read the memory cells to determine which symbols are stored in the cells. For example, after the voltage corresponding to the symbol 10 is applied to a cell during a program operation, the symbol 10 is said to be programmed into the cell. At a later time, the voltage of the cell is sensed and the sensed voltage is compared to one or more read threshold voltages $V_{T11}$, $V^{T21}$, $V_{T31}$ to read the voltage level, and thus determine the symbol stored in the cell. During a read operation, the sensed voltage may first be compared to $V_{T21}$. If the comparison to $V_{T21}$ determines that the sensed voltage is less than $V_{T21}$, then the symbol stored in the cell is either 11 or 10. If the voltage is less than $V_{T21}$, the sensed voltage may next be compared to $V_{T11}$. If the sensed voltage is greater $V_{T11}$, then the symbol stored in the cell is determined to be 10 and if the sensed voltage is less than $V_{T11}$ then the symbol stored in the cell is determined to be 11. If the sensed voltage for this cell deviates from the voltage value programmed into the cell, then an error occurs when the cell is read. For example, if the cell was programmed to be to a voltage between than $V_{T11}$ and $V_{T21}$ (corresponding to symbol 10) but the voltage read from the cell during a subsequent read corresponds to data symbol 11, then an error occurs.

Errors can arise from several sources. Charge stored in a memory cell may need to be retained for months or years, e.g., longer than 10 years, even in the absence of power. Even a low charge leakage rate from the memory cell can cause data errors to occur if the retention time, τ, is substantial. Disturb and/or interference effects may occur when the charge stored on the floating gate of a transistor memory cell is disturbed unintentionally by local electrical signals present when other memory cells are erased, written to (programmed), and/or read.

Generally, a variety of error correction code (ECC) algorithms are known that can identify and/or correct a known number of bit errors for a predefined word size and number of ECC bits. Memory systems may use multiple levels of error coding (e.g., inner and outer coding) to improve overall error correction performance. The BER is used to gauge the performance of the memory in general. Soft information can be used by some types of decoders, e.g., low-density parity-check (LDPC) decoders, and provides a measure on the reliability of a bit being a "0" or a "1". The soft information can be used to develop a log likelihood ratio (LLR) which represents the bit read from the memory cell along with reliability information. The soft information can be developed in various ways, e.g., based on a noise distribution of the channel or by multiple reads of the memory cells.

Although ECC can be used to detect and correct some errors, the use of optimal $V_T$s used to read memory cells can reduce the number of errors that need to be detected and/or corrected. To determine an optimal set of $V_T$ values for MLC devices, the $V_T$s may be adjusted to levels different from previously used $V_T$s. For example, referring to FIG. 2B, a set of offsets, $\Delta V_{T1}$, $\Delta V_{T2}$, $\Delta V_{T3}$ may be applied to the set of $V_T$s, $V_{T11}$, $V_{T21}$, $V_{T31}$. The resulting set of $V_T$s after offsets $\Delta V_{T1}$, $\Delta V_{T2}$, $\Delta V_{T3}$ are applied is $V_{T12}$, $V_{T22}$, $V_{T32}$.

It should be noted that in an arrangement such as shown in FIGS. 2A and 2B, the two bits in each cell need not be associated with the same word or page. For example, a memory system may be arranged so that the leftmost bit (most significant bit, or MSB) is associated with one word/page, and the rightmost bit (least significant bit, or LSB) is associated with another word/page. This arrangement may be referred to herein as "multipage."

Generally, a bit error occurs when the threshold voltage representing the data deviates from its expected range of values. Thus, in reference to FIG. 3, if the threshold voltage originally programmed to be in the range 302 was later readback as being in the adjacent range 303, then a one-bit error ("10" instead of "11") would occur. A one-bit error would also occur if the threshold voltage was instead in the range 305 ("01" instead of "11"). However, the latter case may represent a more serious physical problem with the underlying cell than the former, because the deviation in the latter case is larger than the former. The existence and extent of these types of deviations may not be apparent when looking at BER alone.

Figure 3:
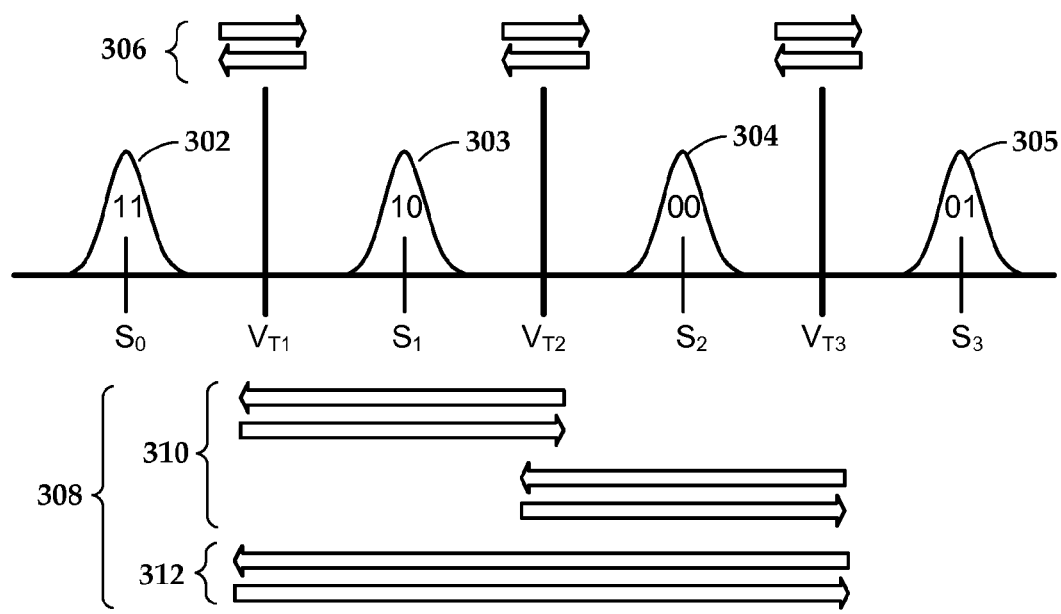
FIG. 3 illustrates different types of errors that may occur in multi-level memory cells.

In FIG. 3, arrows generally indicated by reference numeral 306 and 308, represent different categories of errors that may be manifested by a memory device according to example embodiments. These arrows 306, 308 may be referred to herein alternately as voltage shifts and/or errors. The arrows 306, 308 represent a change in floating gate voltages from an expected level to an actual, measured level. For purposes of this discussion, the term "expected levels" at least refers to a range of voltages that should be exhibited by the cell during a read operation, typically without applying any ECC to correct bit errors. The expected levels may differ somewhat from nominal and/or ideal levels, based on such factors as cell age, elapsed time since the data was written, environmental conditions, etc. The operation during which the "actual" voltage value is determined may occur during any type of data access operation, including reads, writes, erasures, etc. If the actual measurement is different than the expected to the extent that a bit error would occur, the arrows 306, 308 indicate a direction and magnitude of that difference.

For the four-level MLC shown in FIG. 3, there are twelve total errors in two groupings 306, 308. The number of these types of errors may be generally represented as M*(M−1), where M is the number of different voltage levels used to store data in each cell. The first group of errors 306 represent a shift that causes the actual voltages to be located in a voltage range 302-305 that is adjacent to the expected range. There are six (2M−2) of these types of errors 306 for two-bit per cell MLC memory. For example, reading a "11" when a "01" was programmed indicates the actual voltage shifted to the left across the $V_{T1}$ boundary.

The second group of errors 308 represents shifts that cause the actual measurements to be located in voltage ranges 302-305 that are not adjacent to the expected voltage ranges 302-305. There are six ($M^2$−3M+2) of these types of errors 308 for two-bit per cell MLC memory. This group 308 is broken into two subgroups, 310 and 312. Subgroup 310 represents shifts of more than one voltage range, and subgroup 312 represents shifts of more than two voltage ranges.

For purposes of discussion, the first group of errors 306 may be referred to as "common" or "simple" errors. This terminology (as well as the terminology "first" and "second") is not intended to require that the underlying causes of the errors are limited to any particular complexity or difficulty to diagnose or correct. The term "simple error" may generally indicate that error 306 is at least more common than errors 308 in a typical memory device. In many instances, simple errors 306 may be caused by phenomena such as loss of charge over time and/or in response to high temperature. Other phenomena that can often lead to simple errors is known as "disturb," which is changes in stored charge of a floating gate caused by activity (e.g., reading, programming) occurring in physically adjacent cells.

In contrast to simple errors 306, complex errors 308 may be less likely to occur in a nominally functioning memory device. While complex errors 308 may be caused by the same phenomena (e.g., passage of time, disturb) that causes simple errors 306, the magnitude of the threshold shift is larger than would normally be expected, even if the device is subjected to extremes within its specified operating conditions. This could be the result of other factors, such as manufacturing defects, localized perturbations (e.g., electrical shock, thermal hotspots), design defects, accelerated wear, etc. For example, some cells may exhibit a failure mode where the state of the cell is not affected by the level to which it is programmed.

Generally, it may be desirable for a device to treat errors of the complex type 308 differently than those of the simple type 306. For example, the complex errors may be indicative of catastrophic error, e.g., an error that a cell or cells may be unreliable or unusable for long-term data storage. Other types of errors, e.g., errors encountered when programming a cell, may also be indicative of catastrophic errors.

Figure 4A:
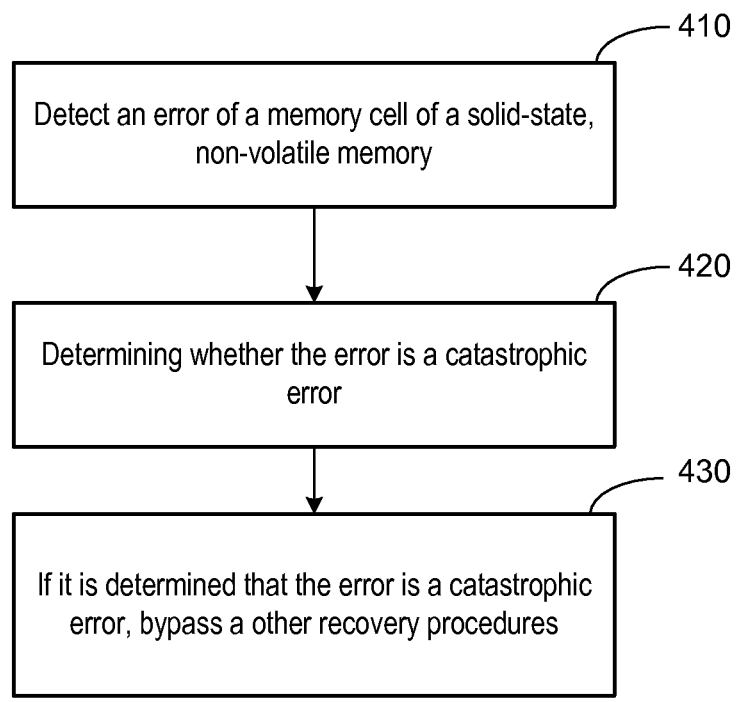
FIGS. 4A, 4B, 5A, and 5B are flow diagrams that show selectively bypassing a voltage recovery process in accordance with various implementations.

FIG. 4A is a flow diagram that shows selectively bypassing a voltage recovery process in accordance with various implementations. An error of a memory cell of a solid-state non-volatile memory is detected 410. It is determined 420 whether the error is a catastrophic error. If it is determined that the error is a catastrophic error, bypass 430 other recovery procedures. In some cases, if it is determined that the error is not a catastrophic error, the voltage recovery process is not bypassed.

Figure 4B:
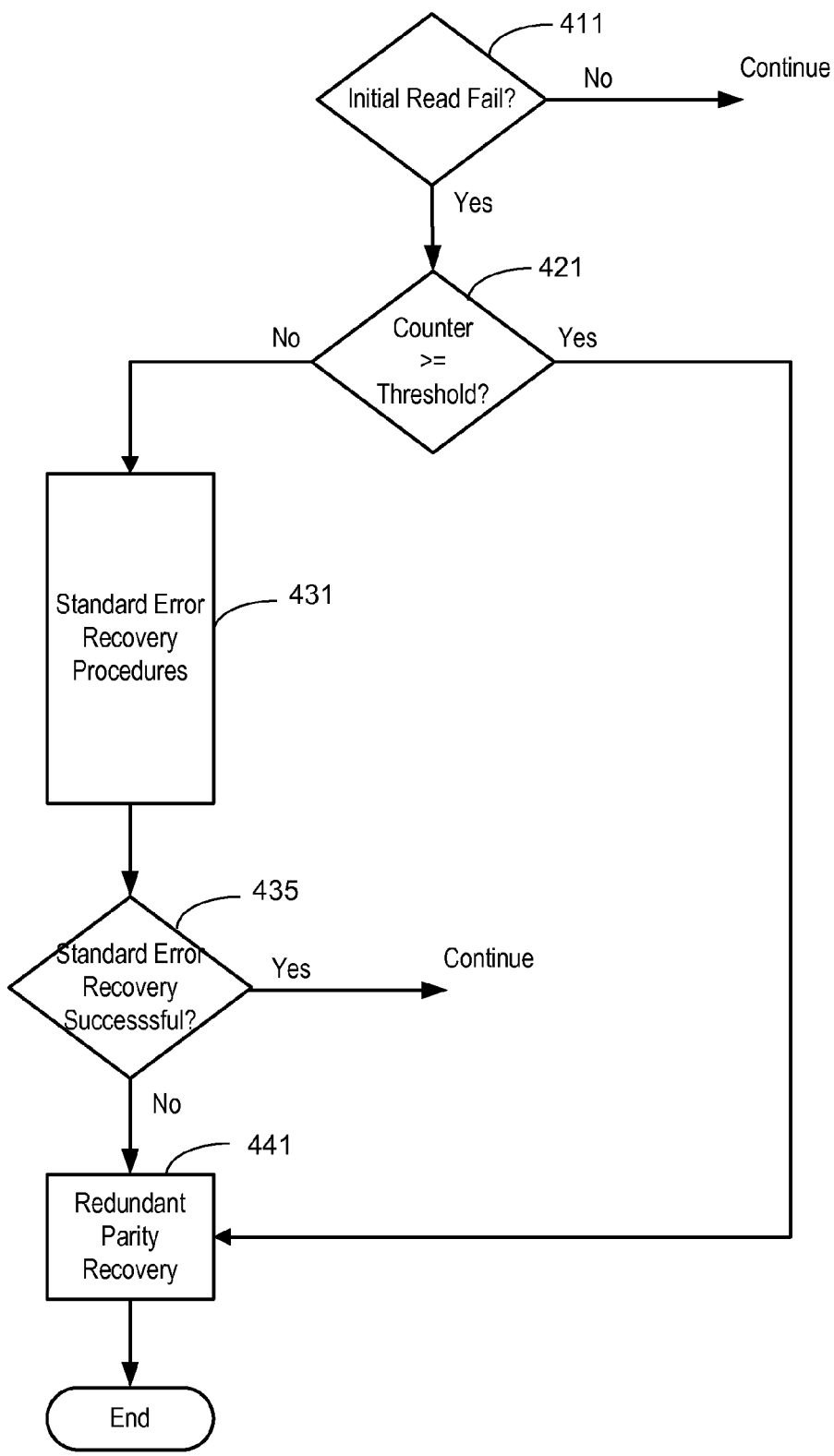

FIG. 4B shows a more detailed flow diagram of the process described in conjunction with FIG. 4A. It is determined 411 whether an initial read fails. If it is determined 411 that the read does not fail, there is no read error detected and the system continues without going through an error recovery process. If it is determined 411 that the read does fail, an error is detected and the system attempts to determine if the detected error is a catastrophic error. The system may determine if the detected error is a catastrophic error by determining 421 if a counter is greater than or equal to a threshold.

A linear ECC may add parity bits, where each parity bit is the XOR of a subset of the data bits, such that the XOR is 0 (or the number of 1's in each subset is even). An LDPC code is a linear ECC where the subset of data-bits, that each parity bit XOR's, is very small. An LDPC decoder is an iterative decoder. An LDPC decoder detects convergence by calculating the XOR associated with each parity. When all parity bits result in XOR value of 0, the codeword is assumed to be converged since all parity constraints are all satisfied. When an LDPC decoder does not converge, then at least one parity has an odd XOR associated with it. The counter is the number of parity bits that have associated with them XOR of 1. So a counter value of 0 means all the parity constraints are satisfied and the code has converged. A low (but nonzero) value of the counter suggests almost convergence which could happen if not all iterations are available or when an error floor event has occurred, for example. When a catastrophic error occurs, a large number of parity bits will not satisfy the even XOR constraint. Hence, after a large number of iterations when a counter value is still larger than a threshold, it may imply a massive failure. The threshold may be 15%, 25%, 40%, and/or 50% of the parity bits, for example.

If it is determined 421 that the counter is not greater than the threshold, no catastrophic error is detected and the system goes through one or more standard error recovery procedures 431. The system determines 435 if the standard error recovery was successful. If it is determined 435 that the standard error recovery was not successful the system goes through a redundant parity recovery 441 and the process ends. If it is determined 435 that the standard error recovery was successful, the system continues without going through a redundant parity recovery procedure 441. If it is determined 421 that the counter is greater than the threshold, a catastrophic error is detected and the process bypasses the standard error recovery procedures 431 to the redundant parity recovery process 441 and the process ends.

Figure 5A:
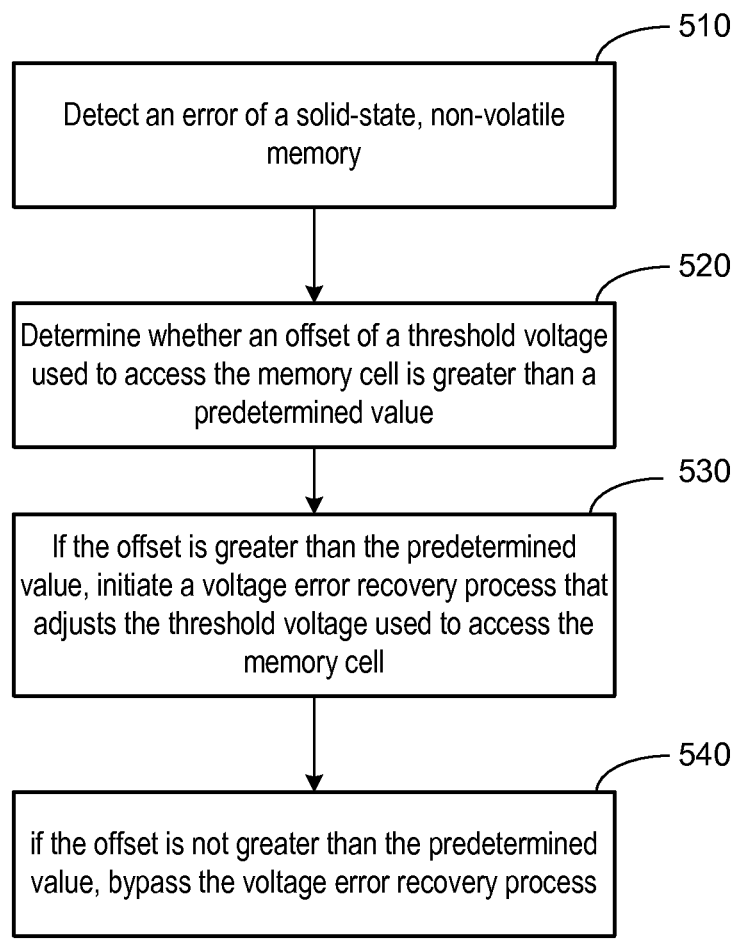

FIG. 5A is a flow diagram that illustrates bypassing a voltage recovery process in accordance with embodiments described herein. An error of a memory cell of a solid-state non-volatile memory is detected 510. It is determined 520 whether an offset of a threshold voltage used to access the memory cell is greater than a predetermined value. In some cases, determining 520 whether an offset of a threshold voltage is greater than a predetermined value is done by reading a reference pattern stored in the memory, and using the reference pattern to determine whether the offset of the threshold voltage is greater than the predetermined value. The reference pattern detection process can also be useful to determine the magnitude and direction of a voltage threshold shift. If it is determined that offset is greater than the predetermined value, a voltage error recovery process is initiated 530 that adjusts the threshold voltage used to access the memory cell. If it is determined that the offset is not greater than the predetermined value, the voltage error recovery process is bypassed 540. A redundant parity process is initiated and the process ends.

Figure 5B:
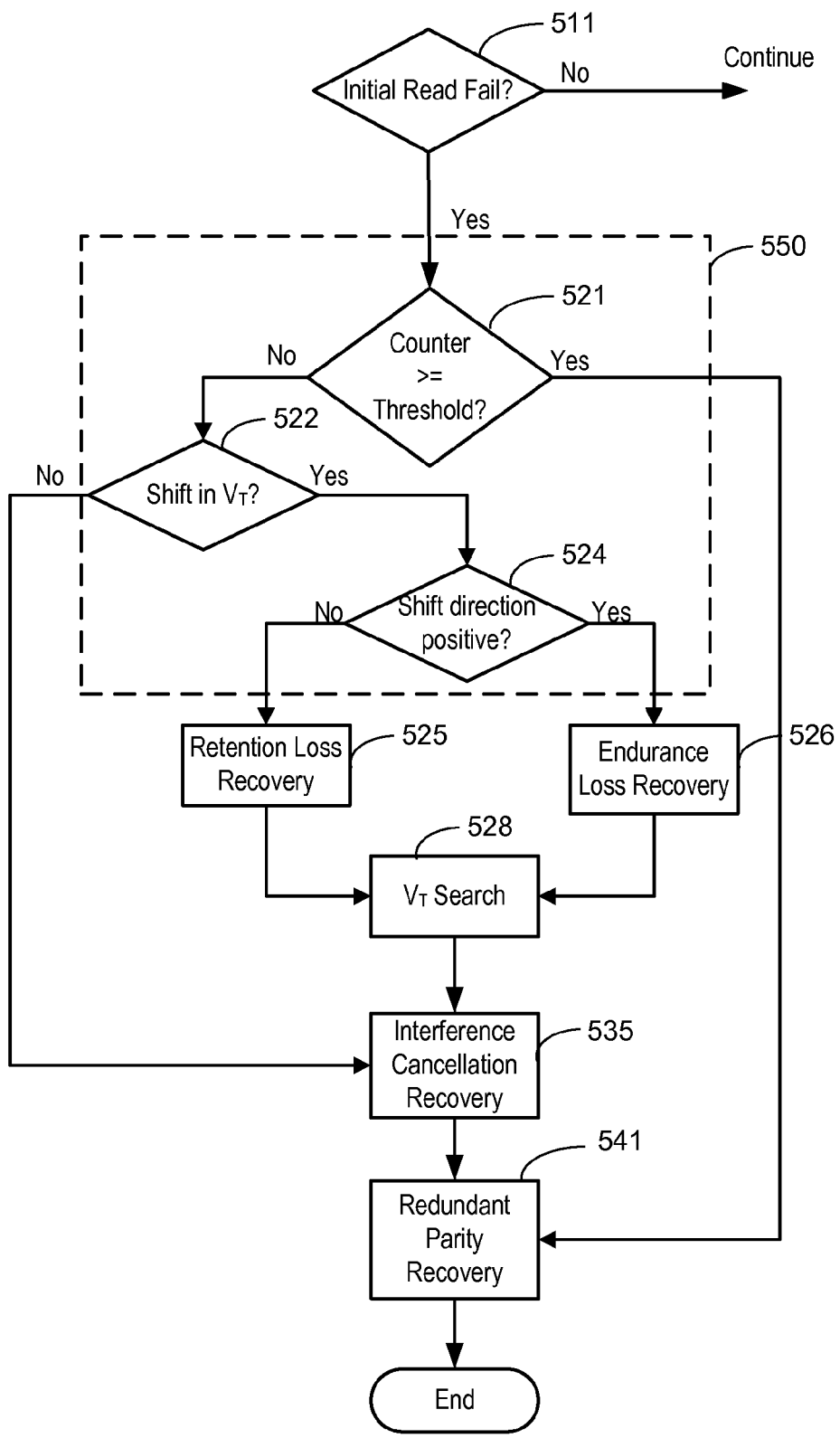

FIG. 5B is another flow diagram showing a process for bypassing standard error recovery according to some implementations. It is determined 511 whether an initial read fails. If it is determined 511 that the read does not fail, there is no read error detected and the system continues without going through an error recovery process. If it is determined 511 that the read does fail, an error is detected and the system attempts to determine a type of error in box 550. The system determines 521 if the detected error is a catastrophic error. The system may determine if the detected error is a catastrophic error by determining 521 if a counter is greater than or equal to a threshold. If it is determined 521 that the counter is greater than the threshold, a catastrophic error is detected and the process bypasses the standard error recovery to the redundant parity recovery process 541 and the process ends. If it is determined 521 that the counter is not greater than the threshold, no catastrophic error is detected and the system determines 522 if there was a shift in the threshold voltage. In some cases, the system makes an affirmative determination of a threshold voltage shift if the threshold voltage shift is greater than a threshold. For example the system may determine that there was a threshold voltage shift if the shift is greater than. If it is determined that there was a threshold voltage shift or that a threshold voltage shift is greater than the threshold, the system determines 524 the direction of the threshold voltage shift. This can be done using the reference pattern stored in memory, as described above. If it is determined 524 that there was a positive threshold voltage shift, the system initiates an endurance loss recovery process 526. If it is determined 524 that there was a negative voltage threshold shift, the system initiates a retention loss recovery process 525. The system determines a new threshold voltage via a threshold voltage search process 528 and the system undergoes an interference cancellation recovery process 535. If it is determined that there was no voltage threshold shift, or that the voltage threshold shift was less than a threshold, the system bypasses the standard error recovery process and jumps to the interference cancellation recovery process 535. A redundant parity process 541 is initiated and the process ends.

The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to in data storage devices as described above.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Although the subject matter has been described in language specific to structural features and/or methodological acts, it is to be understood that the subject matter defined in the appended claims is not necessarily limited to the specific features or acts described above. Rather, the specific features and acts described above are disclosed as representative forms of implementing the claims.

What is claimed is:

1. A method, comprising:
    detecting an error of a solid state memory device in response to a determination that a read to the memory failed;
    determining whether a counter value is above a predetermined value;
    if it is determined that the counter value is above the predetermined value:
        determining that the error is a catastrophic error; and
        bypassing a voltage error recovery process configured to adjust the threshold voltage used to access the memory; and
    if it is determined that the counter value is not above the predetermined value:
        determining if a threshold voltage used to access the memory has been shifted;
        if it is determined that the threshold voltage used to access the memory has been shifted:
            determining a direction of the threshold voltage; and
            initiating a type of voltage error recovery process based on the direction of the voltage shift.

2. The method of claim 1, wherein if it is determined that the error is the catastrophic error, performing a redundant parity recovery process.

3. The method of claim 2, wherein the redundant parity recovery process is an outer code parity process having an outer code and the outer code is a low-density parity check (LDPC) code.

4. The method of claim 2, wherein the redundant parity recovery process is an outer code parity process having an outer code and the outer code is a Reed Solomon code.

5. The method of claim 1, wherein detecting the error of the memory device comprises detecting the error of the memory device by determining that a codeword did not converge.

6. The method of claim 1, wherein the error is detected in response to a decoder not detecting convergence.

7. The method of claim 6, wherein the decoder is a low-density parity check (LDPC) decoder.

8. The method of claim 1, wherein a decoder determines an XOR associated with each parity bit in a codeword and the codeword does not converge if at least one XOR results in a value of 1.

9. The method of claim 8, wherein the counter value is the number of parity bits in which the associated XOR results in a value of 1.

10. A method, comprising:
    detecting an error of a solid state memory device in response to a determination that a read to the memory failed;
    determining whether a counter value is above a predetermined value;
    if it is determined that the counter value is above the predetermined value:
        determining that the error is a catastrophic error;
        bypassing a voltage error recovery process, the voltage error recovery process configured to adjust the threshold voltage used to access the memory; and
        performing a redundant parity recovery process;

if it is determined that the counter value is not above the predetermined value:
  determining if a threshold voltage used to access the memory has been shifted;
  if it is determined that the threshold voltage used to access the memory has been shifted:
    determining a direction of the threshold voltage shift; and
    initiating a type of voltage error recovery process based on the direction of the voltage shift.

11. An apparatus comprising:
a controller capable of being coupled to a solid state memory, the controller configured to perform:
detecting an error of the memory based on a determination that a read to the memory failed;
determining whether a counter value is above a predetermined value;
if it is determined that the counter value is above the predetermined value:
  determining that the error is a catastrophic error; and
  bypassing a voltage error recovery process, the voltage error recovery process configured to adjust the threshold voltage used to access the memory;
if it is determined that the counter value is not above the predetermined value:
  determining if a threshold voltage used to access the memory has been shifted;
  if it is determined that the threshold voltage used to access the memory has been shifted:
    determining a direction of the threshold voltage shift; and
    initiating a type of voltage error recovery process based on the direction of the voltage shift.

12. The apparatus of claim 11 wherein if it is determined that the error is the catastrophic error, the controller is configured to perform a redundant parity recovery process.

13. The apparatus of claim 12, wherein the redundant parity recovery process is an outer code parity process having an outer code and the outer code is a low-density parity check (LDPC) code.

14. The apparatus of claim 12, wherein the redundant parity recovery process is an outer code parity process having an outer code and the outer code is a Reed Solomon code.

15. The apparatus of claim 11, wherein the controller is configured to detect an error of the memory device by determining that a codeword did not converge.

16. The apparatus of claim 11, wherein the controller is configured to detect the error in response a decoder not detecting convergence.

17. The apparatus of claim 16, wherein the decoder is a low-density parity check (LDPC) decoder.

18. The apparatus of claim 11, wherein initiating a type of voltage error recovery process based on the direction of the voltage shift further comprises:
  initiating an endurance loss recovery process if it is determined that voltage shift was positive; and
  initiating a retention loss recovery process if it is determined that the voltage shift was negative.

19. The apparatus of claim 11, wherein if it is determined that the threshold voltage used to access the memory has not been shifted, initiating an interference cancellation recovery process.

* * * * *